(12) United States Patent
Hailey et al.

(10) Patent No.: US 8,198,903 B2
(45) Date of Patent: Jun. 12, 2012

(54) CHASSIS SHIELDING EFFECTIVENESS EVALUATION SYSTEM

(75) Inventors: Jeffrey C. Hailey, Austin, TX (US); Jorge C. Marcet, Austin, TX (US); Leroy Jones, Jr., Round Rock, TX (US); Raymond A. McCormick, Round Rock, TX (US); Todd W. Steigerwald, Austin, TX (US); Tze-Chuen Toh, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 339 days.

(21) Appl. No.: 12/687,611

(22) Filed: Jan. 14, 2010

(65) Prior Publication Data

US 2011/0169503 A1    Jul. 14, 2011

(51) Int. Cl.
*G01R 27/00* (2006.01)
(52) U.S. Cl. .................................. 324/627; 324/750.26
(58) Field of Classification Search .................. 324/627, 324/628, 750.26
See application file for complete search history.

(56) References Cited

U.S. PATENT DOCUMENTS

| | | | |
|---|---|---|---|
| 2,446,195 A * | 8/1948 | Shive | 324/627 |
| 5,153,524 A | 10/1992 | McCormack | |
| 5,828,220 A | 10/1998 | Carney et al. | |
| 6,255,830 B1 | 7/2001 | Rollin et al. | |
| 7,173,434 B2 | 2/2007 | Tarvainen et al. | |
| 7,772,856 B2 * | 8/2010 | Funato et al. | 324/713 |
| 2007/0246771 A1 | 10/2007 | McCormack et al. | |

OTHER PUBLICATIONS www.intel.org/technology/magazine/computing/it12021.pdf, Jan. 14, 2010.
ieeexplore.ieee.org/iel5/10111/32404/01513500.pdf, Jan. 14, 2010.

* cited by examiner

*Primary Examiner* — Vincent Q Nguyen
(74) *Attorney, Agent, or Firm* — Haynes and Boone, LLP

(57) ABSTRACT

A chassis shielding effectiveness evaluation system includes a chassis having a chassis ground. A board is located in the chassis and includes a board ground layer. A signal generator includes at least one ground member coupled to the chassis ground and a signal member coupled to the board ground layer. The signal generator is operable to send a signal through the signal member to the board ground layer.

19 Claims, 22 Drawing Sheets

CHASSIS SHIELDING EFFECTIVENESS EVALUATION SYSTEM

BACKGROUND

The present disclosure relates generally to information handling systems, and more particularly to system for evaluating the effectiveness of shielding in an information handling system chassis.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include a chassis that houses a plurality of electronic components and/or mechanical components (that may include additional electronic components). It is desirable to design the chassis in order to shield electrical noise and/or interference produced by the IHS components from the outside of the chassis. Chassis designs are typically evaluated for their Electro-Magnetic Compatibility (EMC) effectiveness by placing a noise/interference-radiating antenna inside the chassis design and measuring the noise/interference that escapes from the chassis to determine how much of the noise/interference is shielded by the chassis design. While such conventional EMC effectiveness evaluations methods determine the basic effectiveness of the chassis with regard to a radiating antenna within the chassis, there are number of aspects of the chassis EMC effectiveness that are not evaluated.

Accordingly, it would be desirable to provide an improved chassis shielding effectiveness evaluation system.

SUMMARY

According to one embodiment, a chassis shielding effectiveness evaluation system includes a chassis comprising a chassis ground, a board located in the chassis and including a board ground layer; and a signal generator including at least one ground member coupled to the chassis ground and a signal member coupled to the board ground layer, wherein the signal generator is operable to send a signal through the signal member to the board ground layer.

BRIEF DESCRIPTION OF THE DRAWINGS

FIG. 3b is a cross-sectional view illustrating an embodiment of the board of FIG. 3a.

FIG. 3c is a top view illustrating an embodiment of a power layer in the board of FIG. 3a.

FIG. 3d is a top view illustrating an embodiment of a trace layer coupling on the board of FIG. 3a.

FIG. 3f is a top view illustrating an embodiment of a power layer coupling on the board of FIG. 3a.

FIG. 3h is a top view illustrating an embodiment of a ground layer coupling on the board of FIG. 3a.

FIG. 4j is a graph illustrating an embodiment of a signal that may be provided to the layers of the board of FIG. 3a.

FIG. 4k is a perspective view illustrating an embodiment of radiation being measured from the board of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
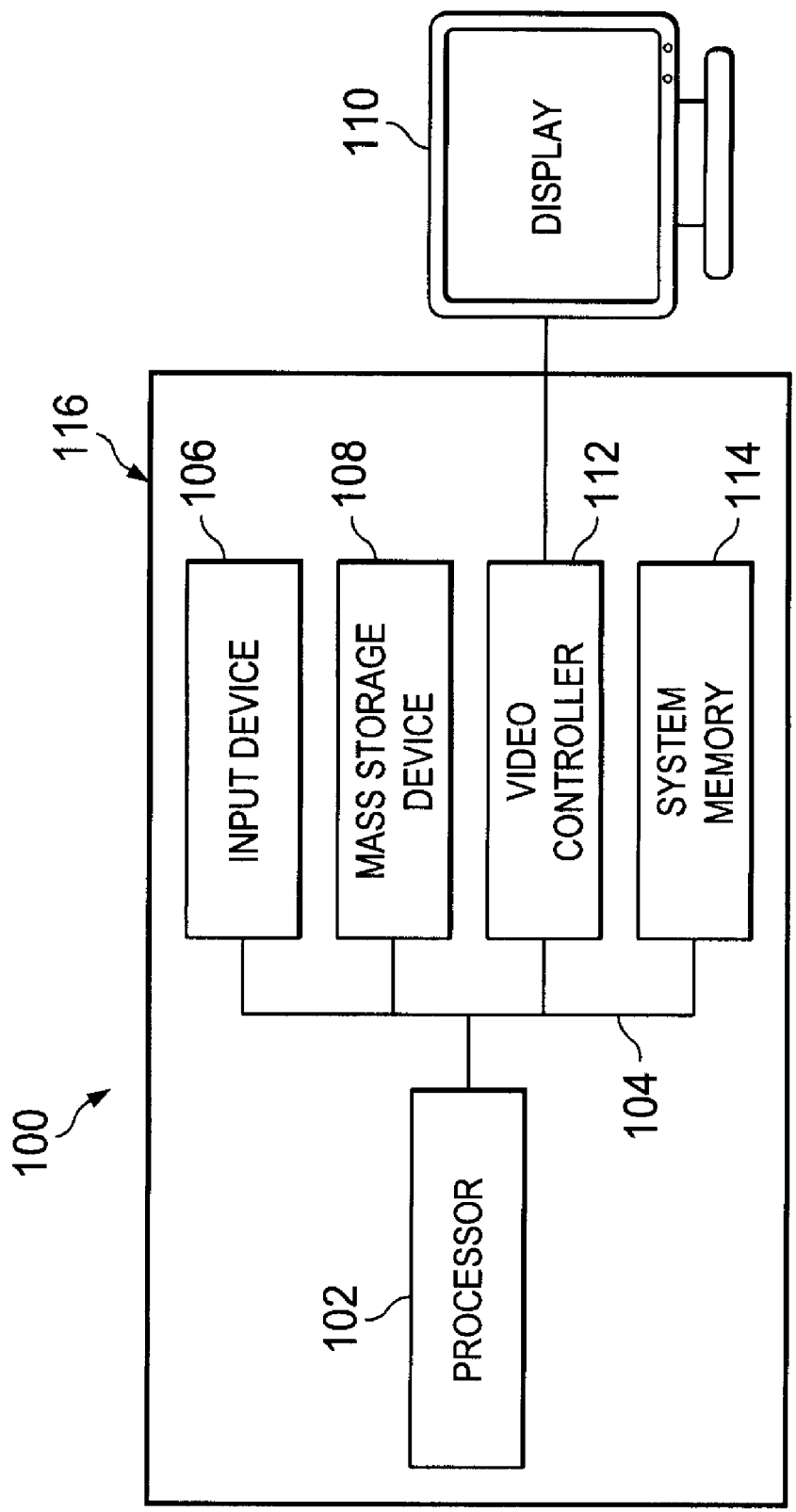
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
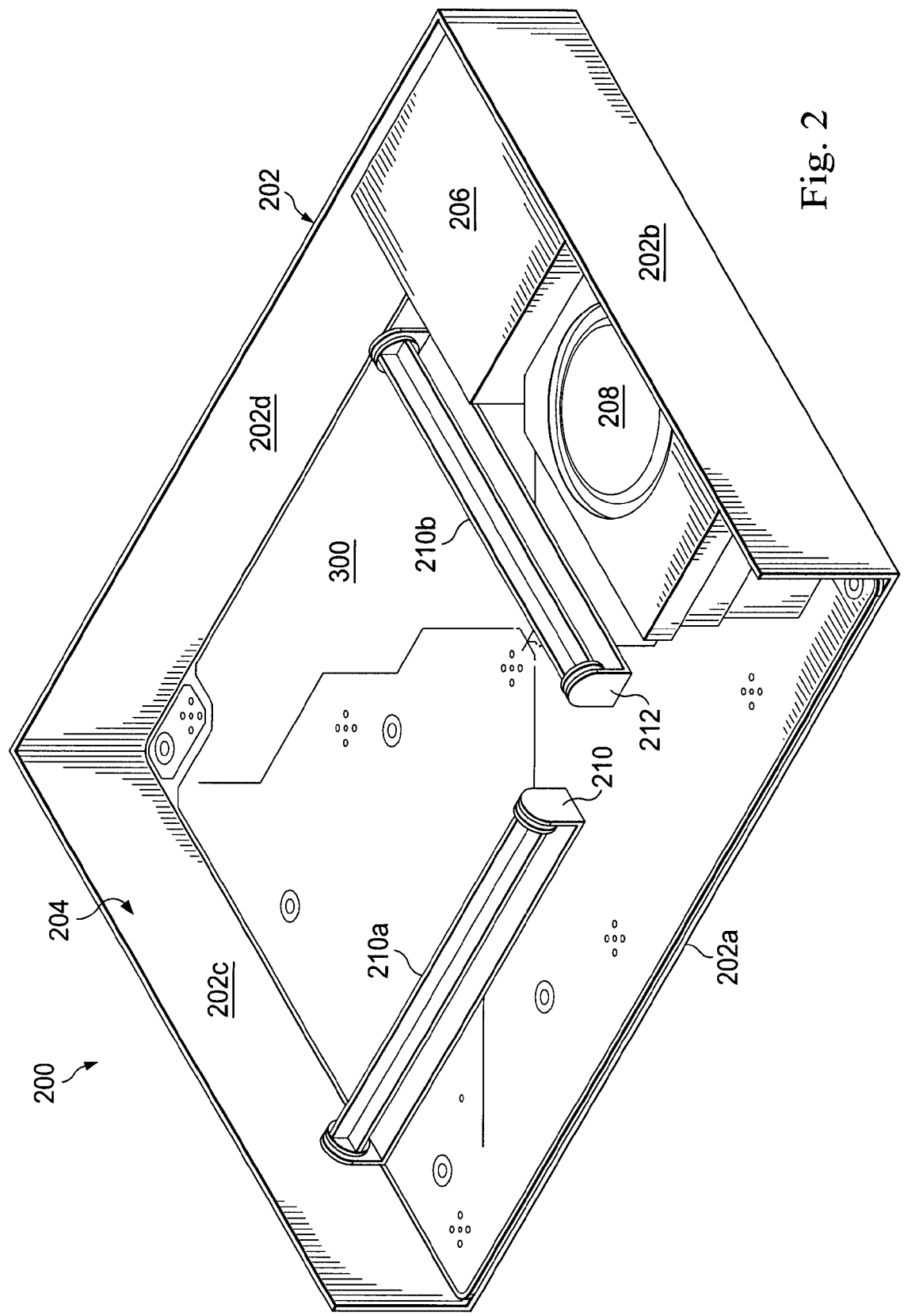
FIG. 2 is a cut-away perspective view illustrating an embodiment of a chassis shielding effectiveness evaluation system.

Referring now to FIG. 2, a chassis shielding effectiveness evaluation system 200 is illustrated. The chassis shielding effectiveness evaluation system 200 includes a chassis 202 (which may be, for example, the chassis 116, described above with reference to FIG. 1) having a chassis floor 202a and a plurality of chassis walls 202b, 202c and 202d extending substantially perpendicularly from the chassis floor 202a. One or more chassis walls have not been illustrated in order to discuss of the contents of the chassis 202, however, one of skill in the art will recognize that addition chassis walls may be included on the chassis 202 such that those walls, the chassis floor 202a, and the chassis walls 202b, 202c and 202d define a chassis housing 204 between them. A plurality of components are located in the chassis housing 204 and include a first component 206 and a second component 208 each located adjacent the chassis wall 202b. In an embodiment, the first component 206 and the second component 208 may be mechanical components, electrical components, and/or combinations thereof. For example, the first component 206 may be a signal generator such as, for example, a radio frequency signal generator, a comb generator, and/or a variety of other signal generators known in the art. In an embodiment, the signal generator is capable of generating frequencies in a range from 30 MHz to 18 GHz. In an embodiment, the second component 208 may be a disk drive. While only two components have been illustrated for clarity, one of skill in the art will recognize that many additional and/or different components may be housed in the chassis 202 without departing from the scope of the present disclosure. A plurality of mode stirrers 210 and 212 are located in the chassis housing 204, each including a rotatable member 210a and 210b, respectively, with the mode stirrer 210 positioned in a different orientation (with respect to the chassis 202) than the mode stirrer 212. For example, in the illustrated embodiment, the mode stirrer 210 extends substantially perpendicularly from the chassis wall 202c, and the mode stirrer 212 extends substantially perpendicularly from the chassis wall 202d. A board 300 is located in the chassis housing 204 adjacent the chassis floor 202a. In an embodiment, the board 300 and/or the components 206 and 208 may be 'test' components that mimic average components that would exist in a variety of chassis. However, in another embodiment, the board 300 and components 206 and 208 may be the actual components that are used in the chassis to be tested.

Referring now to FIGS. 2, 3a, 3b and 3c, the board 300 is illustrated and described in more detail. The board 300 includes a first board portion 300a and a second board portion 300b. The second board portion 300b includes a base 302 having a top surface 302a and a bottom surface 302b located opposite the base 302 from the top surface 302a. Between the top surface 302a and the bottom surface 302b, the base 302 includes a tracer layer 304 that includes the top surface 302b, a power layer 306 located immediately adjacent the tracer layer 304, a board ground layer 308 located immediately adjacent the power layer 306, and a spacer layer 310 that includes the bottom surface 302b and that is located immediately adjacent the board ground layer 308. The tracer layer 304 includes a plurality of traces 304a, 304b, 304c and 304d, each coupled to a clock 304e. While the tracer layer 304 has been illustrated having a plurality of traces coupled to clocks, one of skill in the art will recognize that the tracer layer 300 may include other components and the traces 304a, 304b, 304c and 304d may be coupled to other devices without departing from the scope of the present disclosure. The power layer 306 includes a plurality of power planes 306a, 306b, 306c, 306d, 306e and 306f. In an embodiment, each of the power planes 306a, 306b, 306c, 306d, 306e and 306f includes different dimensions in order to enable each of the power planes 306a, 306b, 306c, 306d, 306e and 306f to radiate at different frequencies when supplied a signal, as will be described in further detail below. In an embodiment, the board ground layer 308 is grounded to the chassis 202 via one or more grounding apertures 311. In an embodiment, the spacer layer 310 may be a layer fabricated from a composite material such as, for example, pre-peg used in the fabrication of boards known in the art, in order to provide the board 300 with desired dimensions (e.g., the dimensions of a standard board typically used in a chassis that is to be evaluated, as will be discussed in further detail below).

Figure 3A:
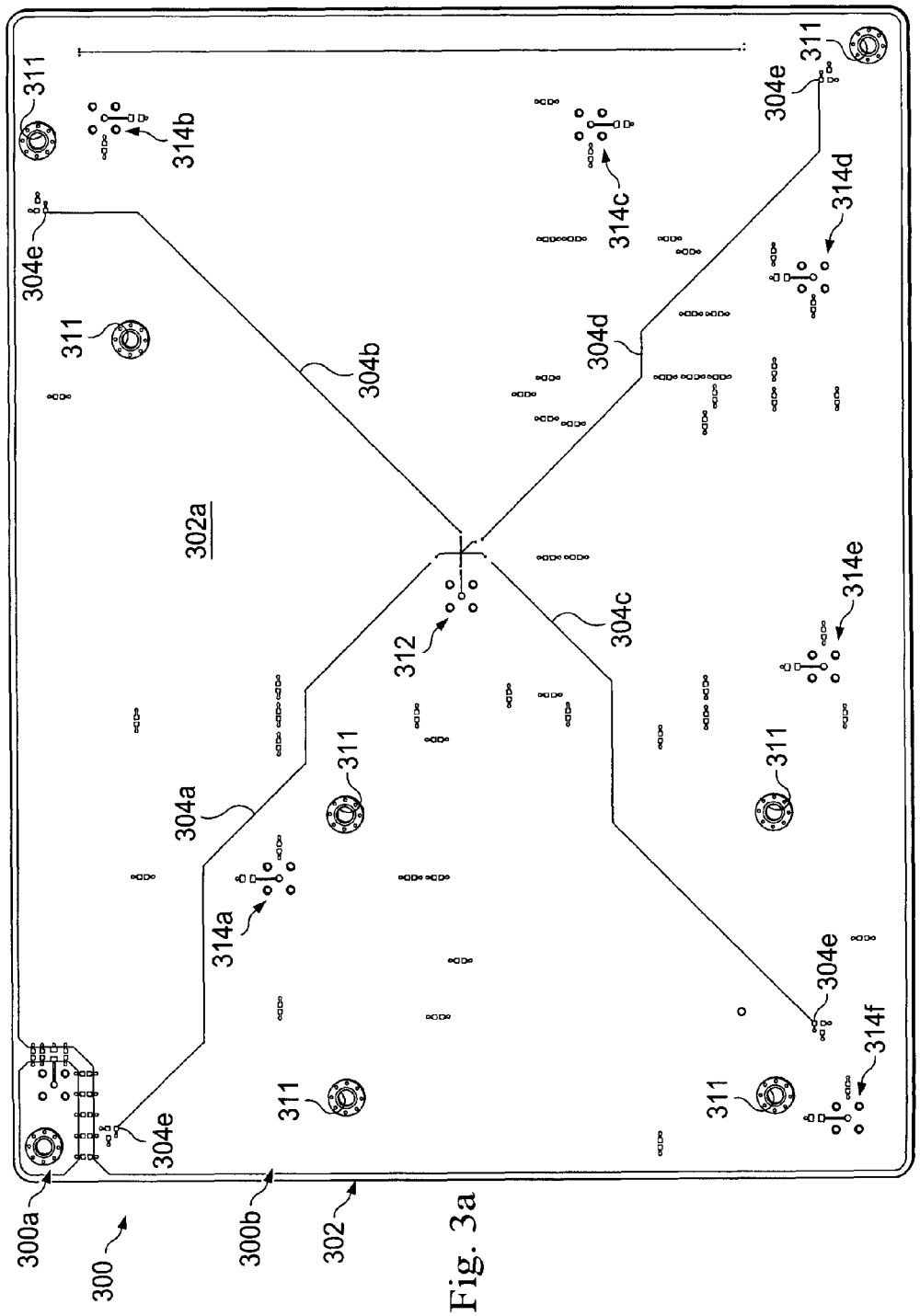
FIG. 3a is a top view illustrating an embodiment of a board used in the chassis shielding effectiveness evaluation system of FIG. 2.
Figure 3B:
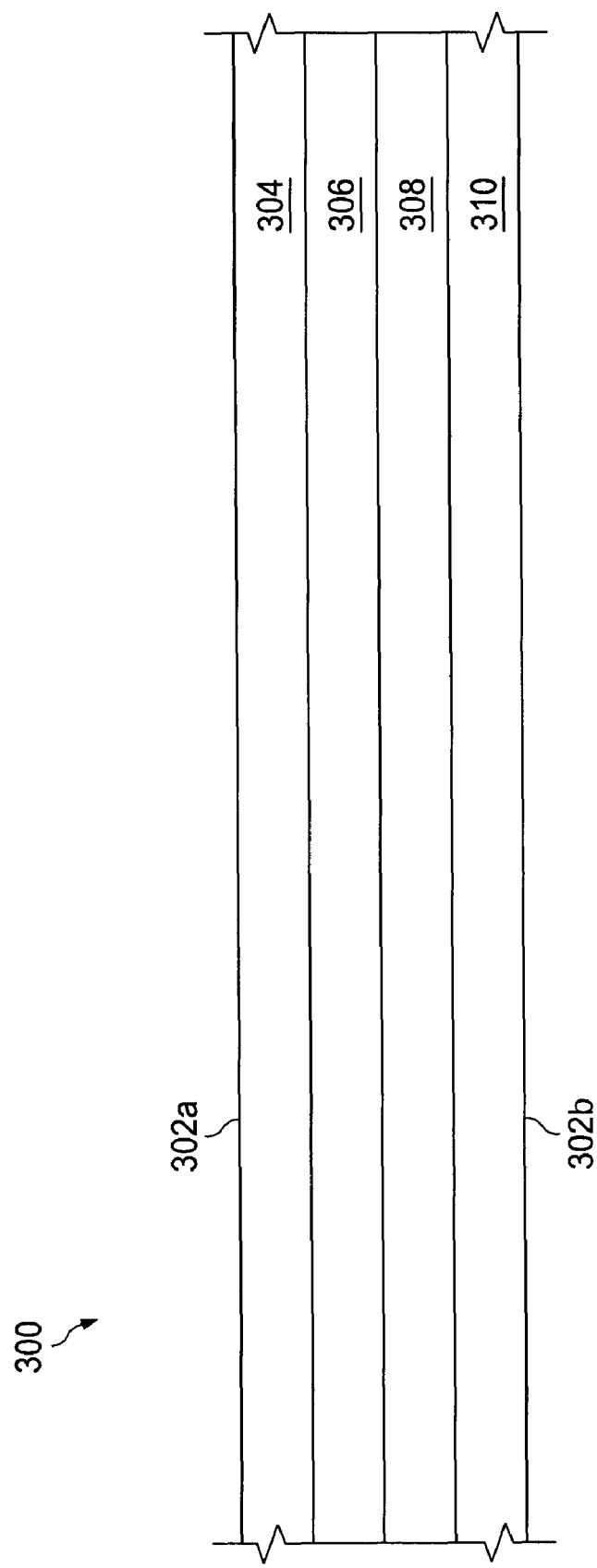
Figure 3C:
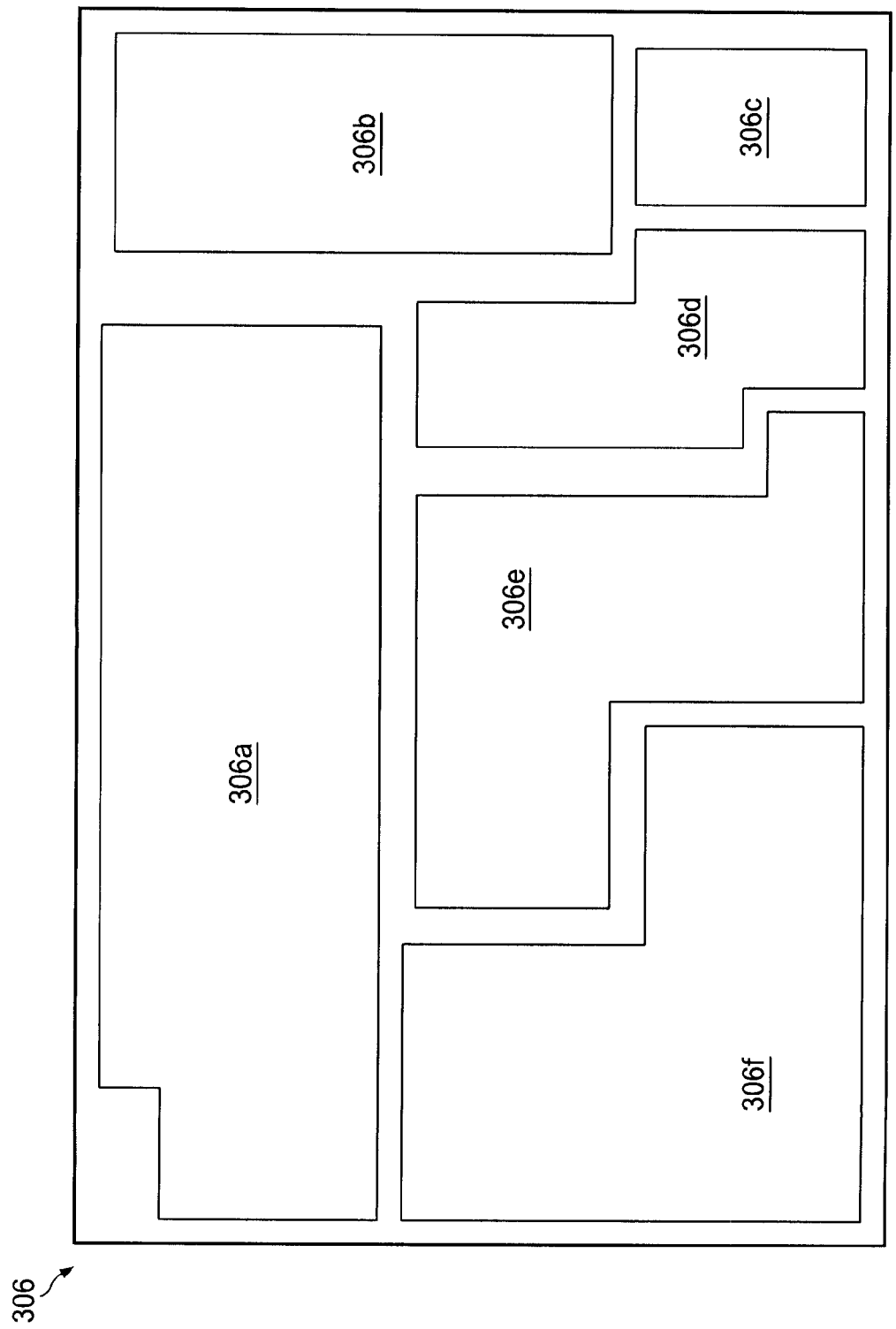
Figure 3D:
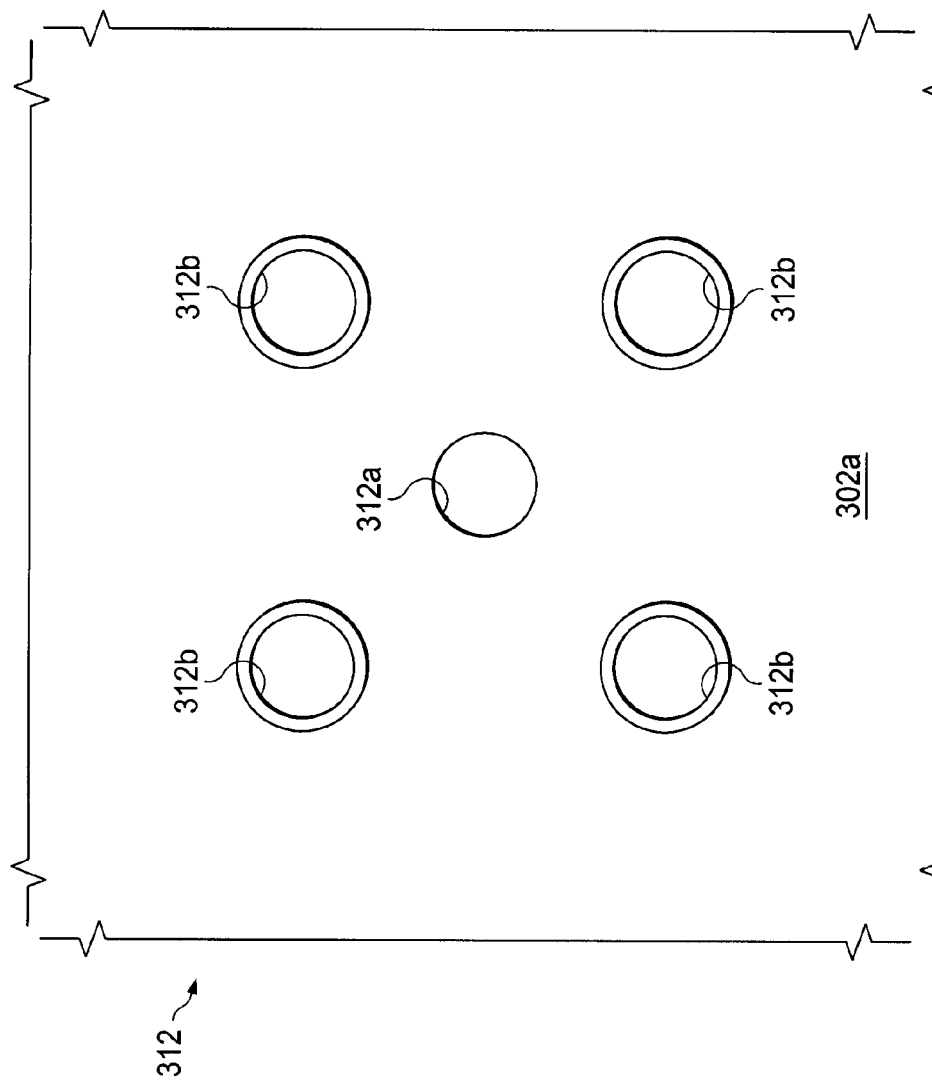
Figure 3E:
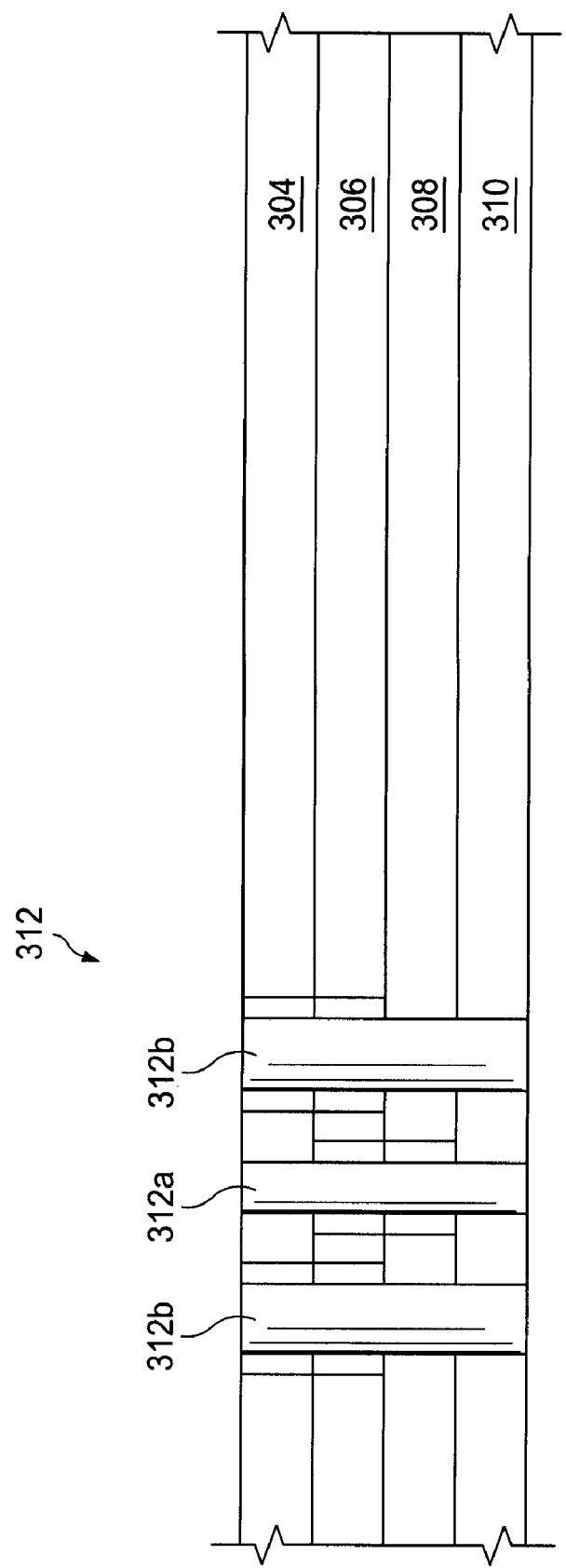
FIG. 3e is a cross-sectional view illustrating an embodiment of the trace layer coupling of FIG. 3d.
Figure 3F:
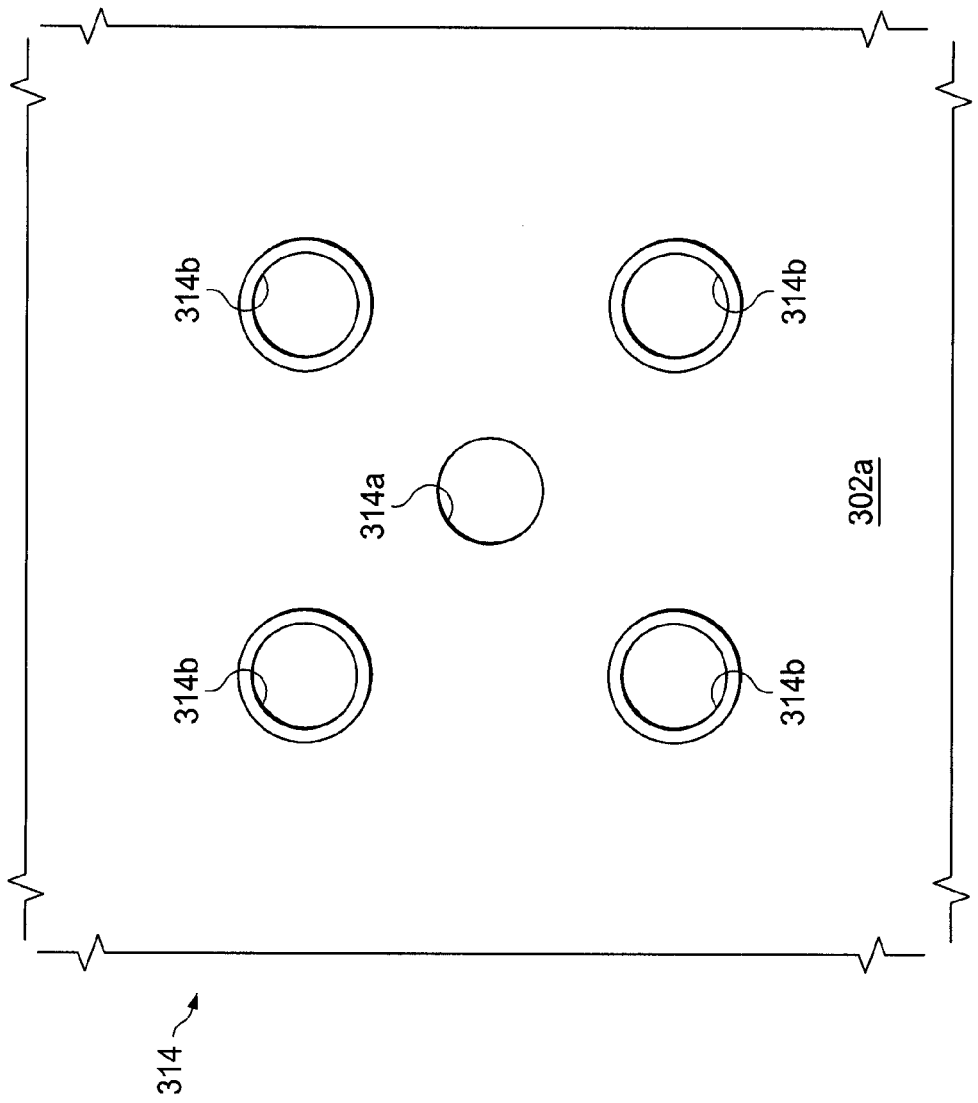
Figure 3G:
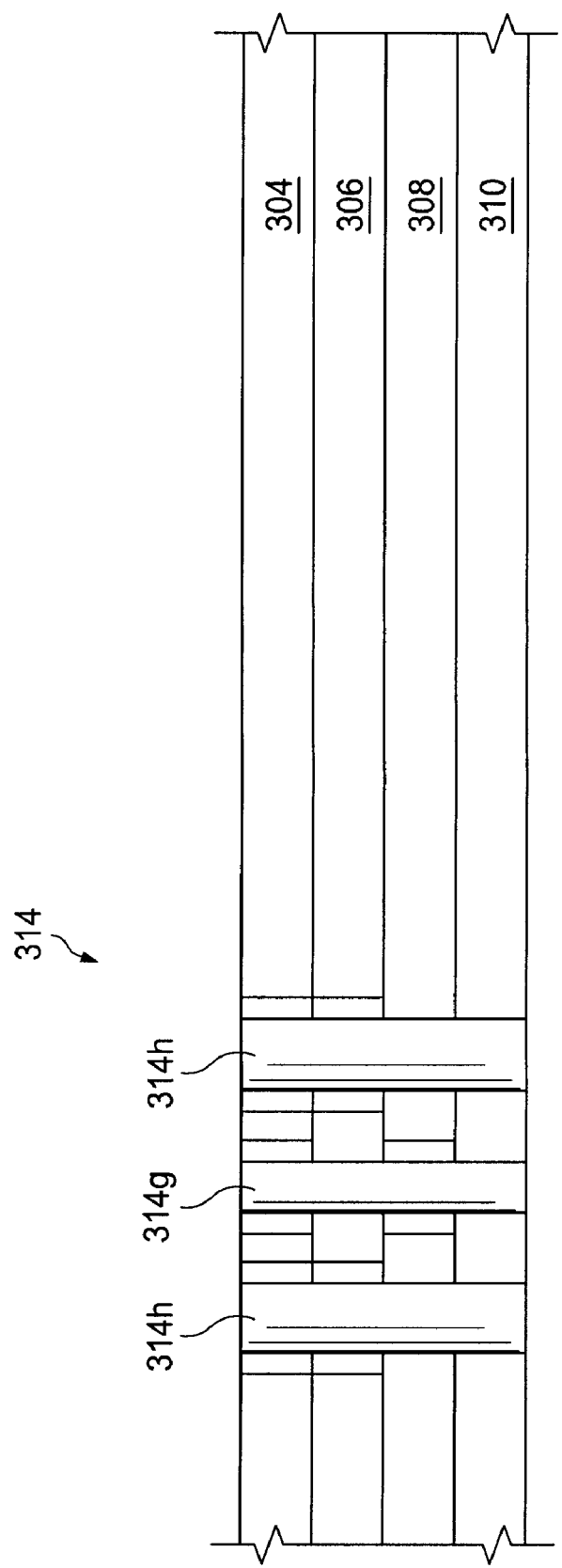
FIG. 3g is a cross-sectional view illustrating an embodiment of the power layer coupling of FIG. 3f.

Referring now to FIGS. 3a, 3d and 3e, a trace layer coupling 312 is located on the board 300 and includes a signal member coupler 312a that is defined by the base 302, extends into the base 302 from the top surface 302a, and allows a signal member that is inserted into the signal member coupler 312a to be coupled to the tracer layer 304, as will be described in further detail below. The trace layer coupling 312 also includes a plurality of ground member couplers 312b that are defined by the base 302, extend into the base 302 from the top surface 302a, and that each allow a ground member that is inserted into the ground member couplers 312b to be coupled to the board ground layer 308, as will be described in further detail below.

Referring now to FIGS. 3a, 3c, 3f and 3g, a plurality of power layer couplings 314a, 314b, 314c, 314d, 314e and 314f are located on the board 300 and provide a coupling to the power planes 306a, 306b, 306c, 306d, 306e and 306f, respectively. For example, the power layer coupling 314a includes a signal member coupler 314g that is defined by the base 302, extends into the base 302 from the top surface 302a, and allows a signal member that is inserted into the signal member coupler 314g to be coupled to the power plane 306a in the power layer 306, as will be described in further detail below. The power layer coupling 314a also includes a plurality of ground member couplers 314h that are defined by the base 302, extend into the base 302 from the top surface 302a, and that each allow a ground member that is inserted into the ground member couplers 314h to be coupled to the board ground layer 308, as will be described in further detail below. While only the power layer coupling 314a has been described, one of skill in the art will recognize how the power layer couplings 314b, 314c, 314d, 314e and 314f may include signal member couplers and ground member couplers that allow a signal member that is inserted into the signal member coupler to be coupled to the power planes 306b, 306c, 306d, 306e and 306f, respectively, and ground members that are inserted into the ground member couplers to be coupled to the board ground layer 308.

Figure 3H:
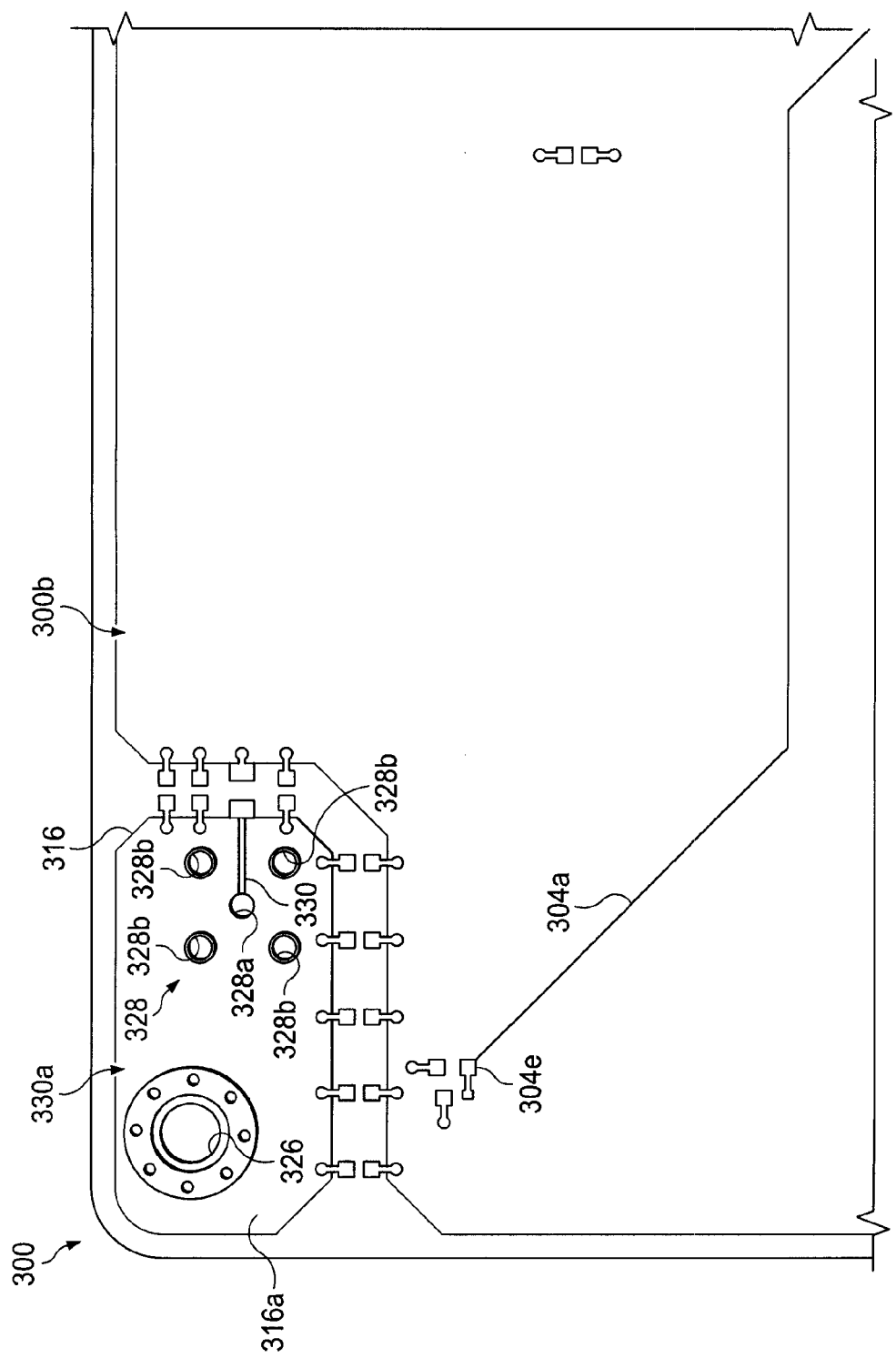
Figure 3I:
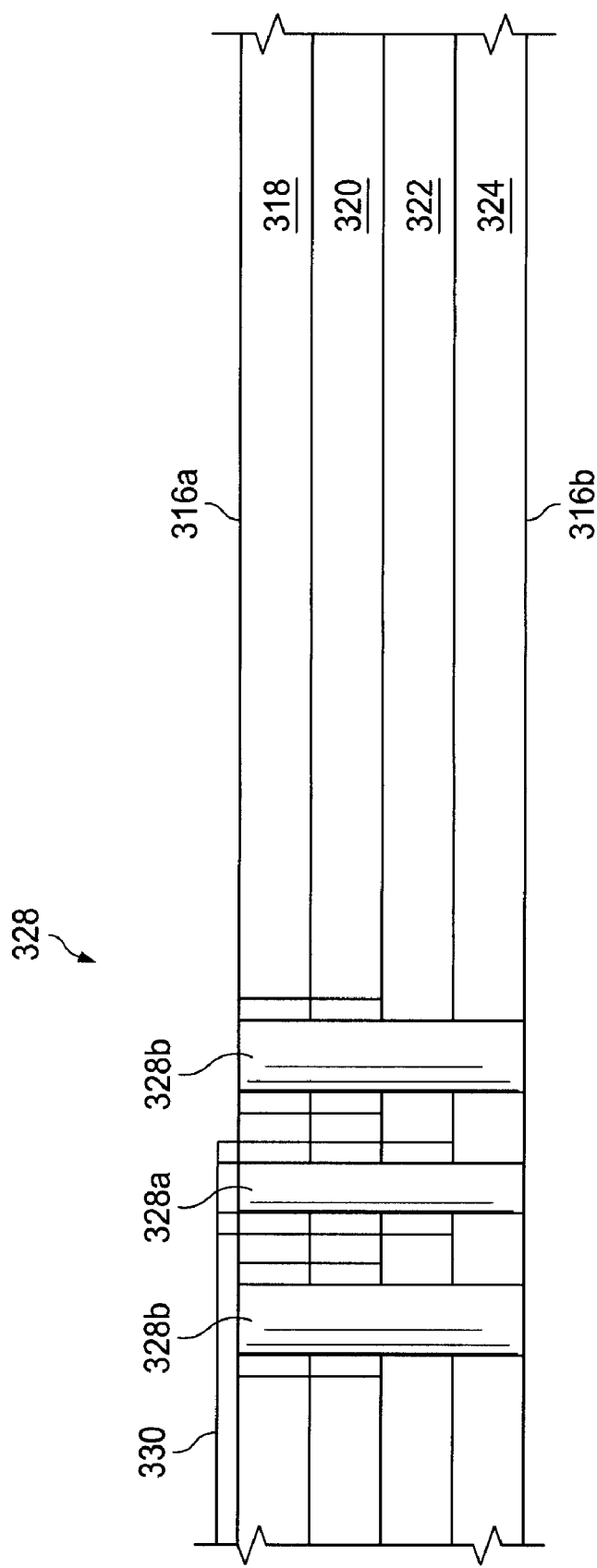
FIG. 3i is a cross-sectional view illustrating an embodiment of the ground layer coupling of FIG. 3h.

Referring now to FIGS. 3a, 3h and 3i, the first board portion 300a is illustrated in more detail. In an embodiment, the first board portion 300a includes a base 316 having a top surface 316a and a bottom surface 316b located opposite the base 316 from the top surface 316a. Between the top surface 316a and the bottom surface 316b, the base 316 includes a tracer layer 318 that includes the top surface 316b, a power layer 320 located immediately adjacent the tracer layer 318, a chassis ground layer 322 located immediately adjacent the power layer 320, and a spacer layer 324 that includes the bottom surface 316b and that is located immediately adjacent the chassis ground layer 322. In an embodiment, the chassis ground layer 322 is grounded to the chassis 202 via a grounding aperture 326. A ground layer coupling 328 is located on the board 300 and includes a signal member coupler 328a that is defined by the base 316 and extends into the base 316 from the top surface 316a. A trace 330 extends between the signal member coupler 328a and the board ground layer 308 on the second board portion 300b (illustrated in FIG. 3b) such that a signal member that is inserted into the signal member coupler 328a will be coupled to the board ground layer 308, as will be described in further detail below. The ground layer coupling 328 also includes a plurality of ground member couplers 328b that are defined by the base 316, extend into the base 316 from the top surface 316a, and that each allow a ground member that is inserted into the ground member coupler 328b to be coupled to the chassis ground layer 322, as will be described in further detail below.

Figure 4A:
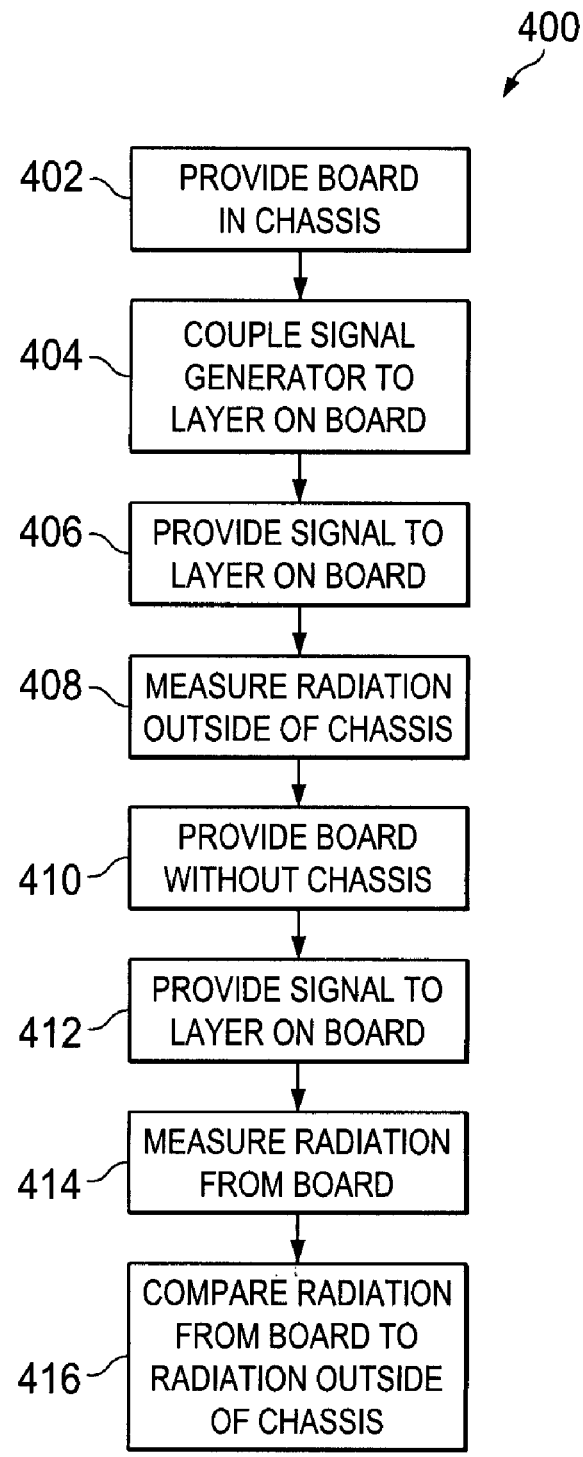
FIG. 4a is a flow chart illustrating an embodiment of a method for evaluating chassis shielding effectiveness.
Figure 4B:
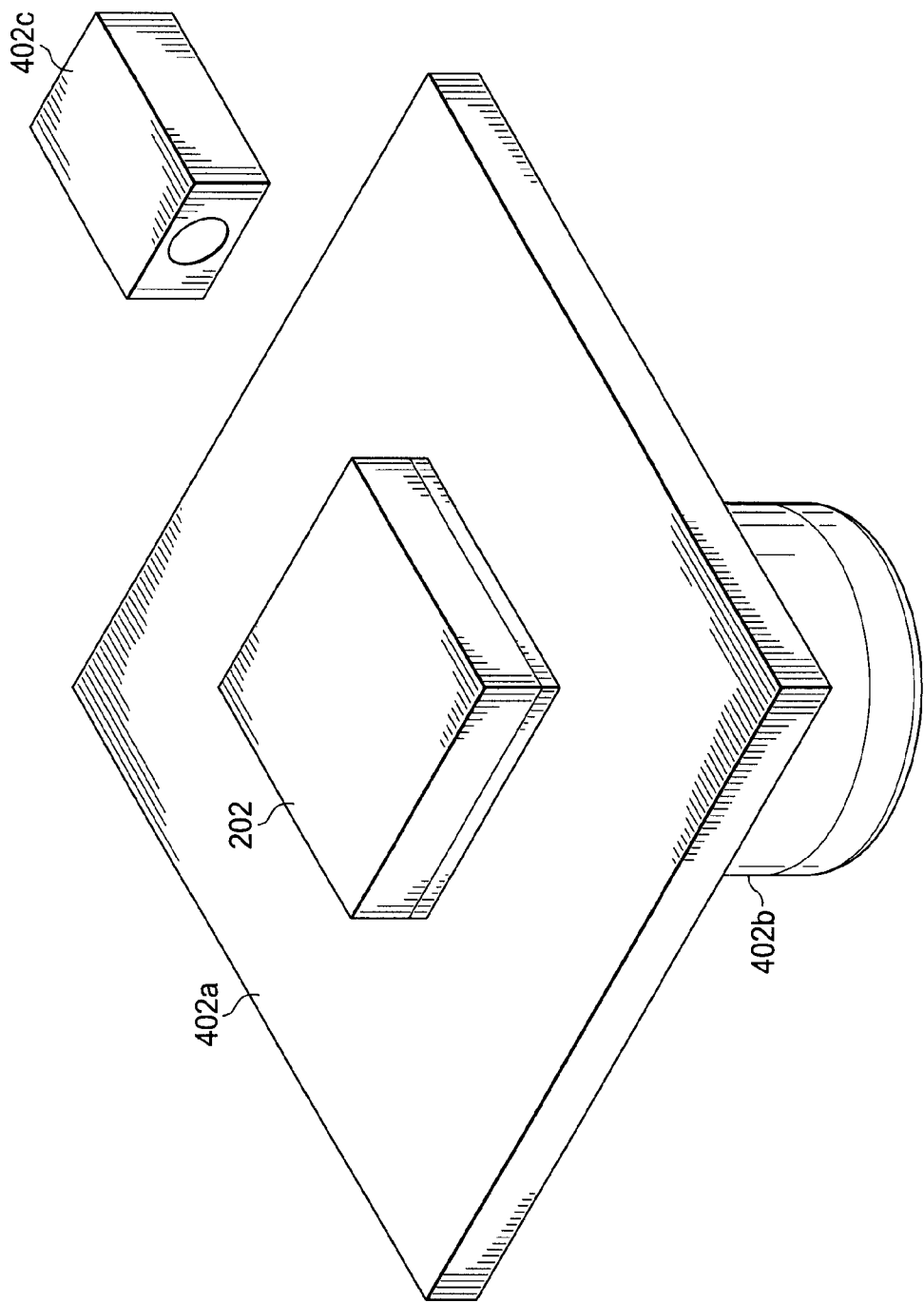
FIG. 4b is a perspective view illustrating an embodiment of radiation being measured from the chassis of FIG. 2.
Figure 4C:
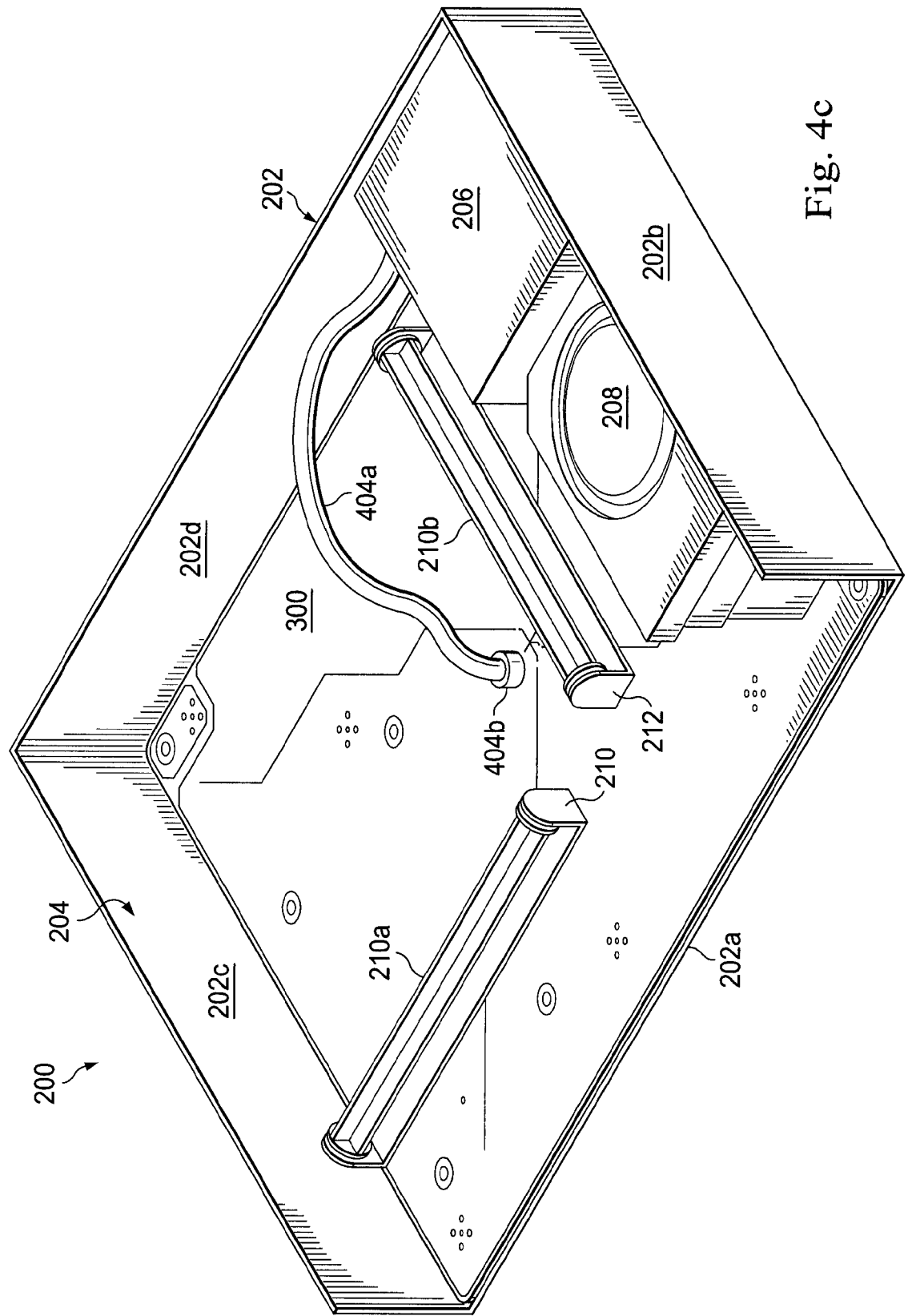
FIG. 4c is a cut-away perspective view illustrating an embodiment of a signal generator coupled to a trace layer on the board of FIG. 3a in the chassis of FIG. 2.

Referring now to FIGS. 4a and 4b, a method 400 for evaluating chassis shielding effectiveness is illustrated. The method 400 begins at block 402 where a board in a chassis is provided. In an embodiment, the board 300 in the chassis 202, described above with reference to FIGS. 2, 3a, 3b, 3c, 3d, 3e, 3f, 3g, 3h and 3i, is provided. In an embodiment, the chassis 202 may be provided on a surface 402a that is coupled to a support 402b. The surface 402a may be rotatably coupled to the support 402b in order to allow the chassis 202 to be rotated. A sensor 402c is located adjacent the support 402a and is operable to detect radiation that may escape from the chassis 202 after being induced in the board 300 by providing a signal to one of the layers in the board 300, as will be described in further detail below.

Figure 4D:
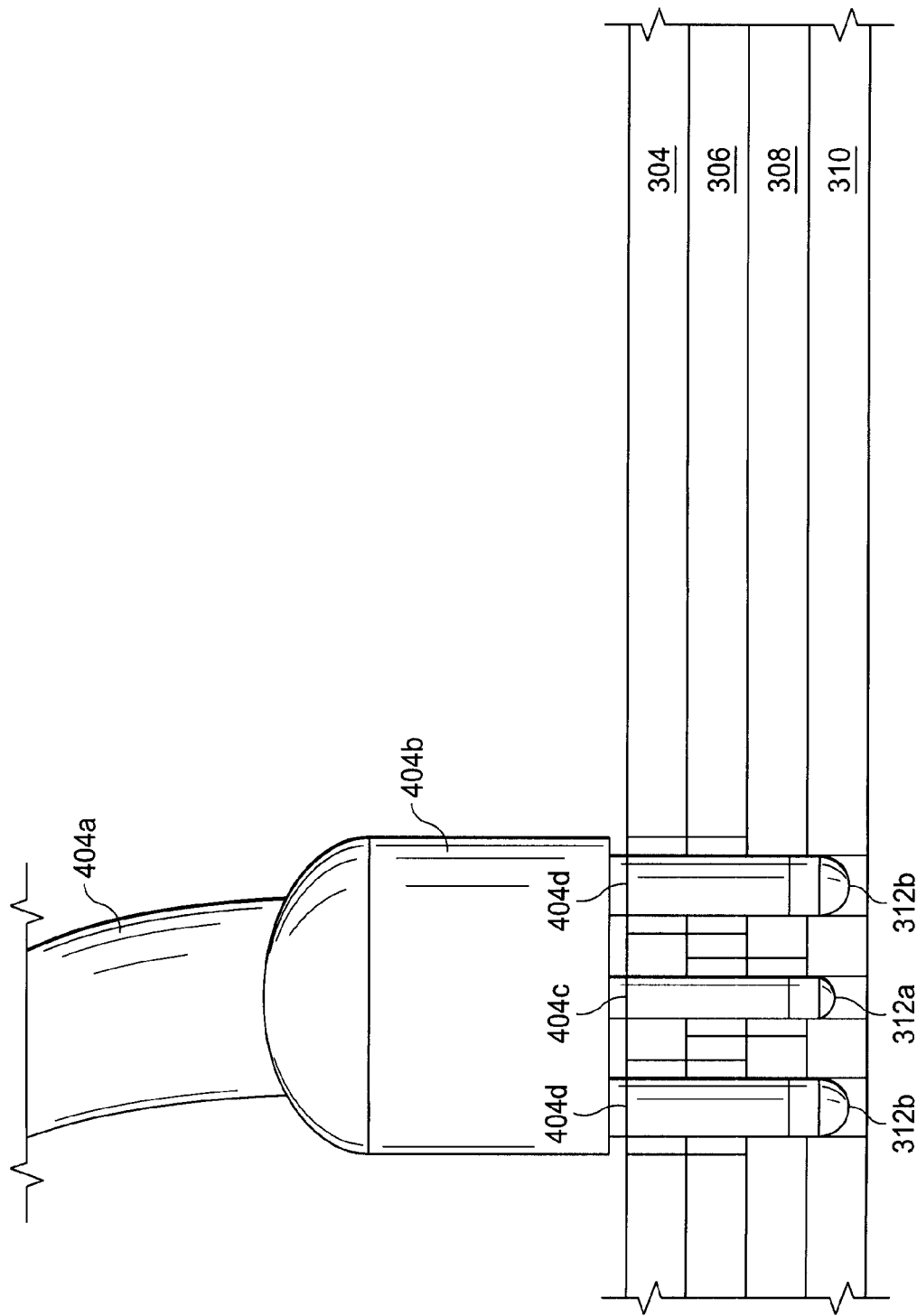
FIG. 4d is a cross-sectional view illustrating an embodiment of the signal generator coupled to the trace layer of FIG. 4c.

Referring now to FIGS. 3a, 3d, 3e, 4a, 4c and 4d, the method 400 then proceeds to block 404, where a signal generator is coupled to a layer on the board. In an embodiment, a cable 404a extends from the signal generator 206 and includes a connector 404b. While the signal generator 206 has been illustrated as being located in the chassis housing 204, one of skill in the art will recognize that the signal generator may be located outside the chassis 202 without departing from the scope of the present disclosure. In a first embodiment, the cable 404a and the connector 404b may be used to connect the signal generator 206 to the trace layer 304 on the board 300 by coupling the connector 404b to the trace layer coupling 312. With the connector 404b coupled to the trace layer coupling 312, a signal member 404c that extends from the connector 404b is located in the signal member coupler 312a and coupled to the trace layer 304, and a plurality of ground members 404d that extend from the connector 404a are each located in a ground member coupler 312b and coupled to the board ground layer 308, as illustrated in FIG. 4d.

Figure 4E:
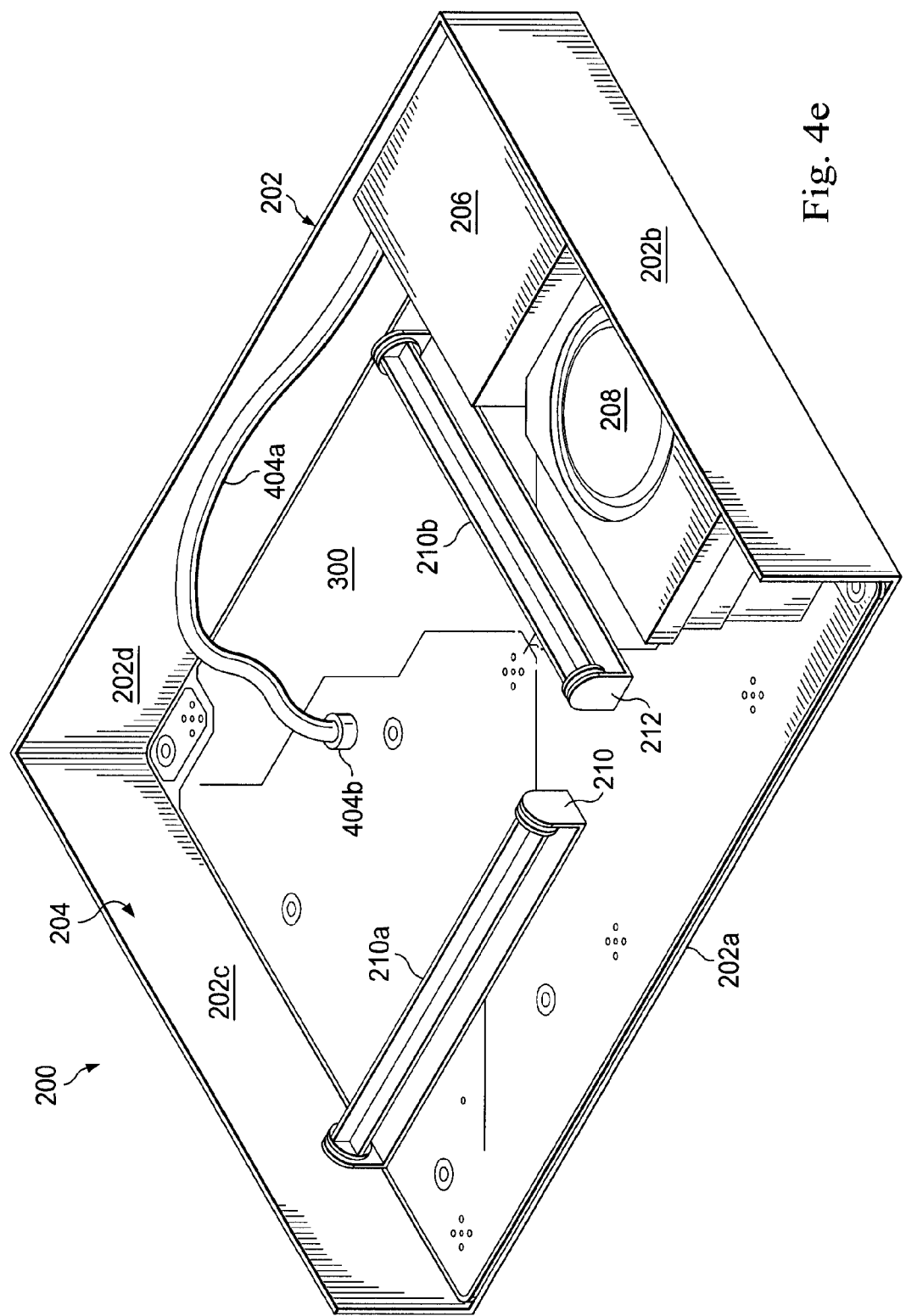
FIG. 4e is a cut-away perspective view illustrating an embodiment of a signal generator coupled to a power layer on the board of FIG. 3a in the chassis of FIG. 2.
Figure 4F:
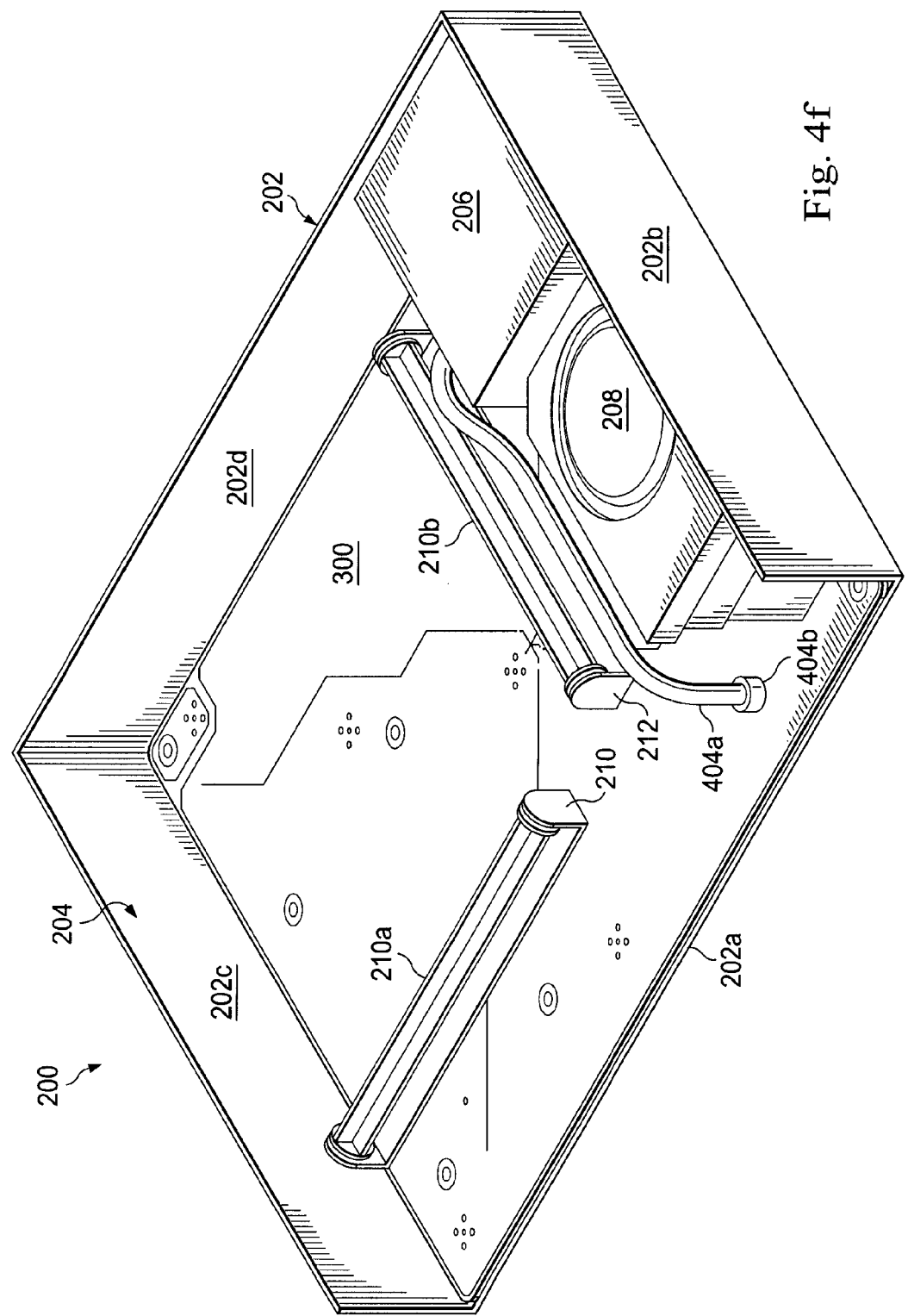
FIG. 4f is a cut-away perspective view illustrating an embodiment of a signal generator coupled to a power layer on the board of FIG. 3a in the chassis of FIG. 2.
Figure 4G:
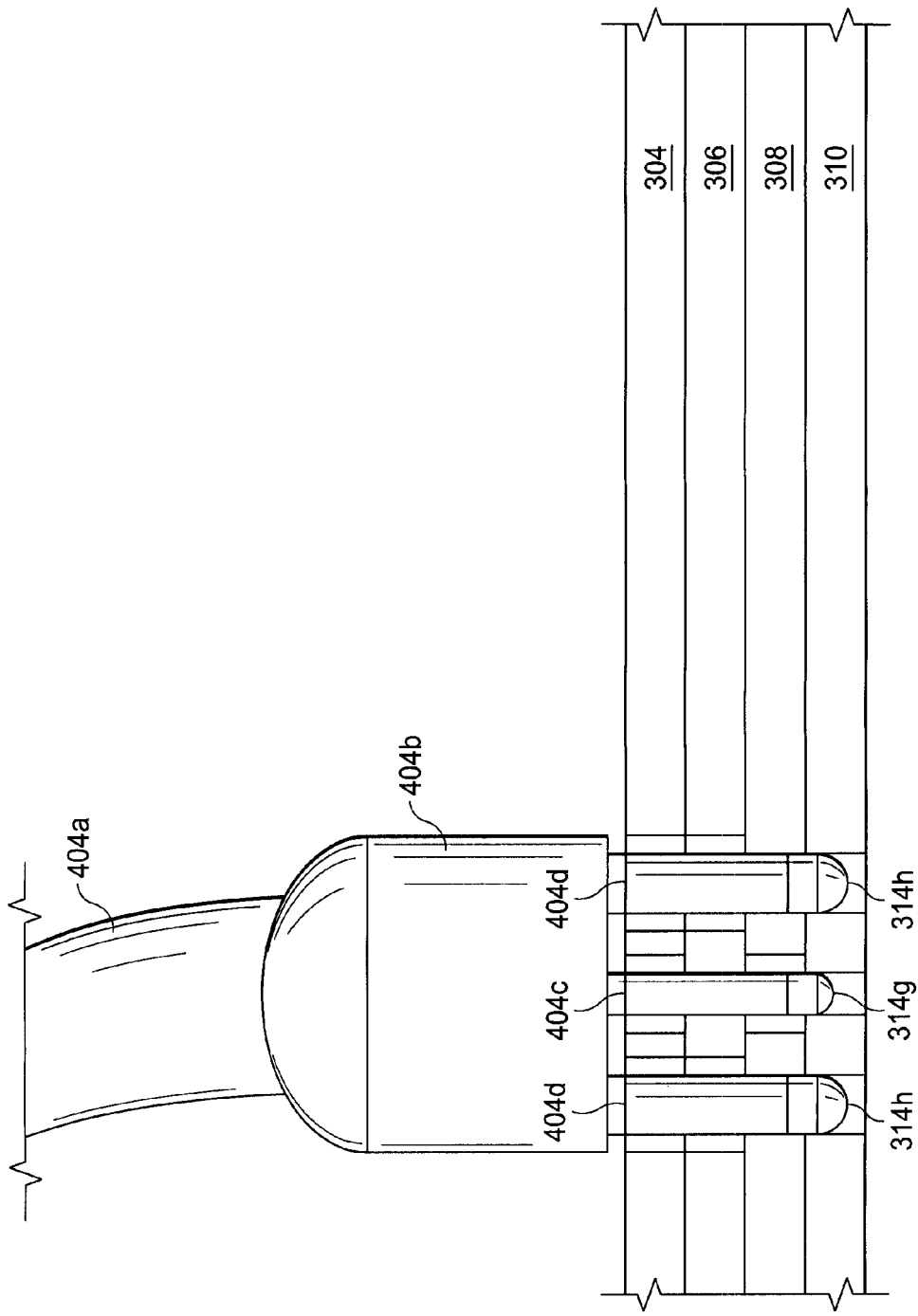
FIG. 4g is a cross-sectional view illustrating an embodiment of the signal generator coupled to the power layer of FIG. 4e or 4f.
Figure 4H:
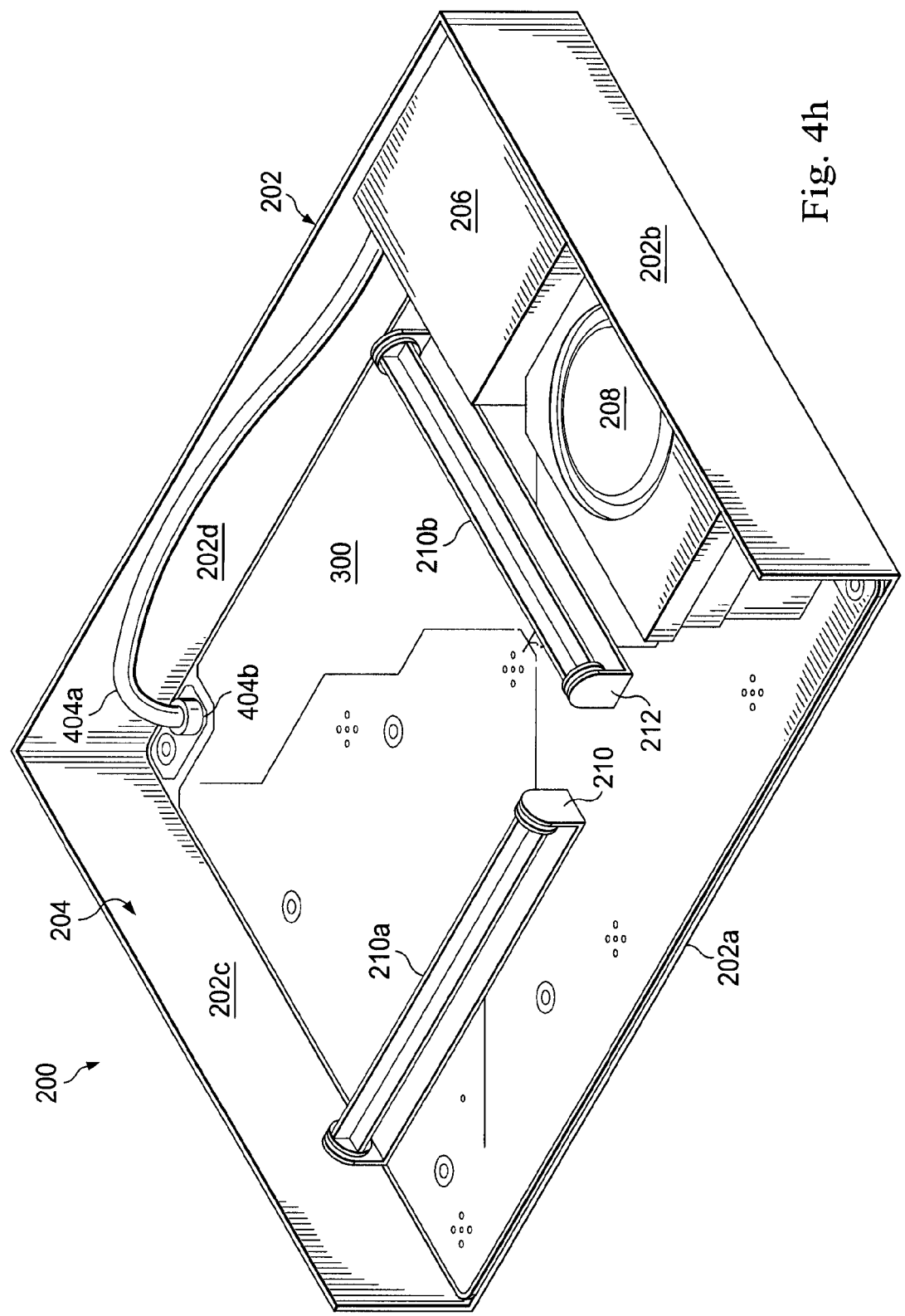
FIG. 4h is a cut-away perspective view illustrating an embodiment of a signal generator coupled to a board ground layer on the board of FIG. 3a in the chassis of FIG. 2.

Referring now to FIGS. 3a, 3c, 3f, 3g, 4a, 4e, 4f and 4g, in a second embodiment, the cable 404a and the connector 404b may be used to connect the signal generator 206 to the power layer 306 on the board 300 by coupling the connector 404b to one of the power layer couplings 314a, 314b, 314c, 314d, 314e and 314f in order to couple the signal generator 206 to one of the power planes 306a, 306b, 306c, 306d, 306e and 306f, respectively. For example, the connector 404b may be coupled to the power layer coupling 314a in order to couple the signal generator 206 to the power plane 306a, as illustrated in FIG. 4e, or the connector 404b may be coupled to the power layer coupling 314d in order to couple the signal generator 206 to the power plane 306c, as illustrated in FIG. 4f. With the connector 404b coupled to the power layer couplings 314a or 314d, the signal member 404c that extends from the connector 404b is located in the signal member coupler 314g and coupled to the power planes 306a or 306d, respectively, in the power layer 304, and the plurality of ground members 404d that extend from the connector 404b are each located in a ground member coupler 314h and coupled to the board ground layer 308, as illustrated in FIG. 4g.

Figure 4I:
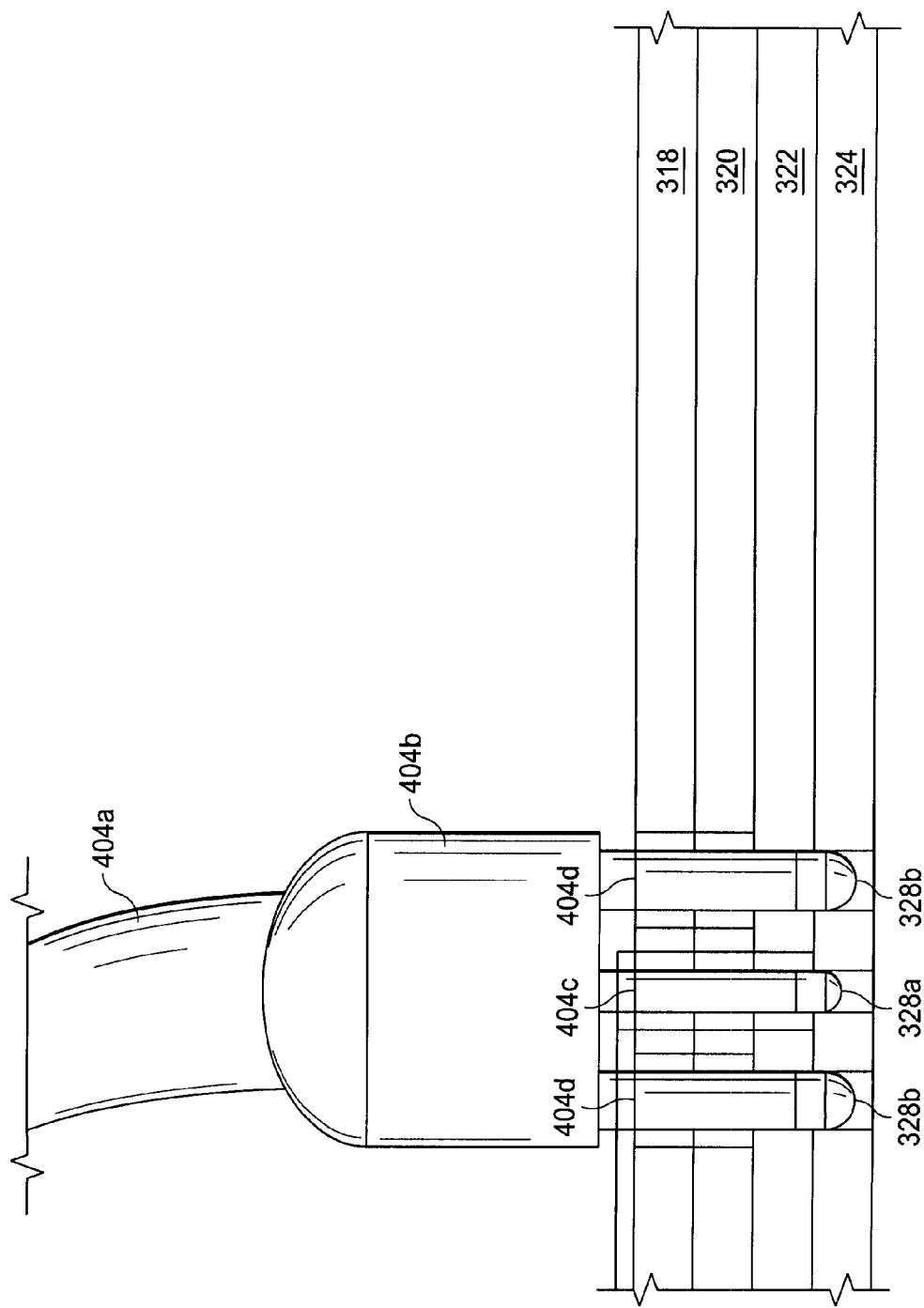
FIG. 4i is a cross-sectional view illustrating an embodiment of the signal generator coupled to the board ground layer of FIG. 4h.

Referring now to FIGS. 3a, 3h, 3i, 4a, 4h and 4i, in a third embodiment, the cable 404a and the connector 404b may be used to connect the signal generator 206 to the chassis ground layer 304 on the first portion 300a of the board 300 by coupling the connector 404b to the ground layer coupling 328. With the connector 404b coupled to the ground layer coupling 328, the signal member 404c that extends from the connector 404b is located in the signal member coupler 328a and coupled to the board ground layer 308 on the second portion 300b of the board 300 through the trace 330, and the plurality of ground members 404d that extend from the connector 404b are each located in a ground member coupler 328b and coupled to the chassis ground layer 322, as illustrated in FIG. 4i.

Figure 4J:
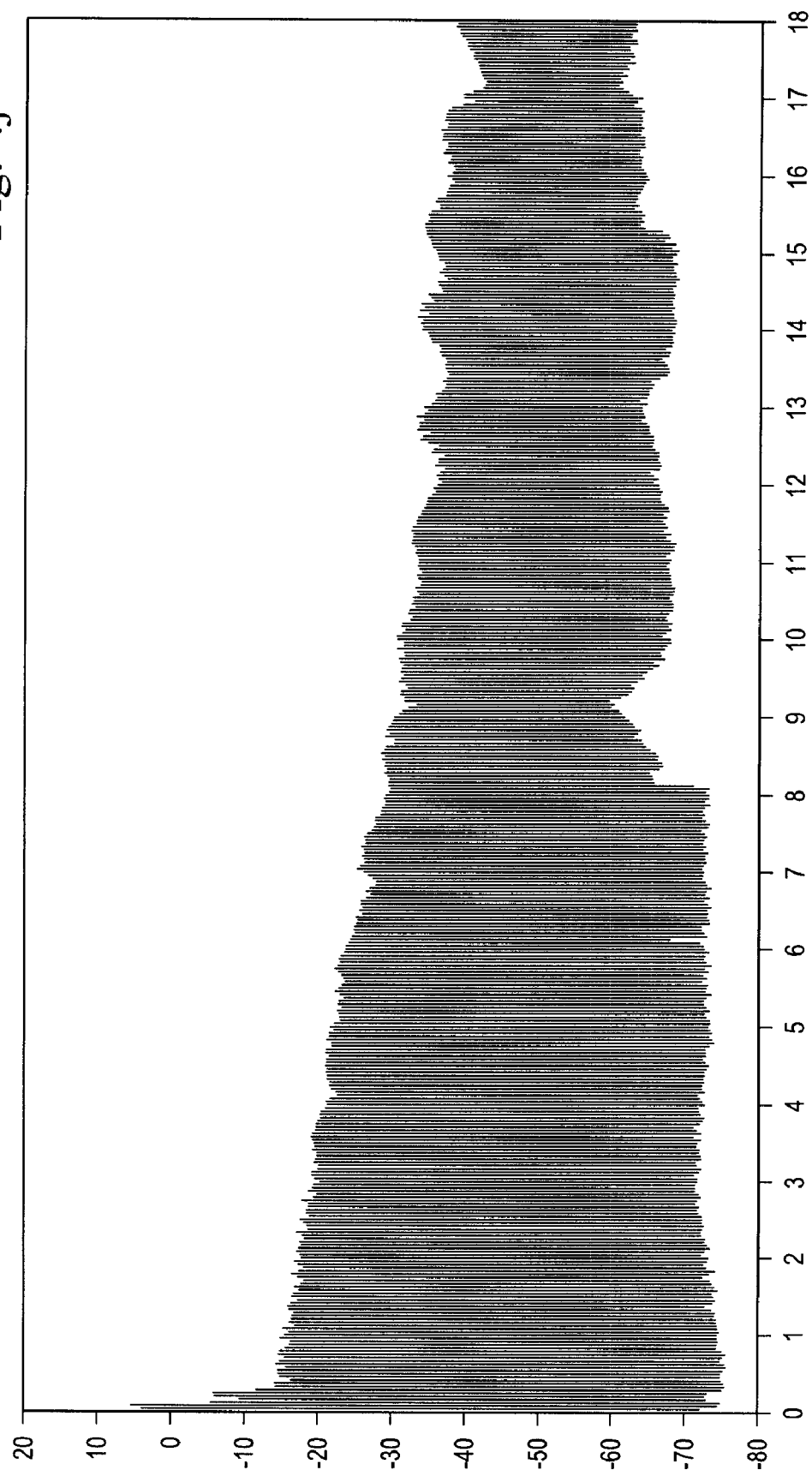

Referring now to FIGS. 2, 4a, 4b, 4c, 4d, 4e, 4f, 4g, 4h, 4i and 4j, the method 400 then proceeds to block 406 where a signal is provided to a layer on the board. The signal generator 206 may provide a signal over a frequency range of 30 MHz to 18 GHz, an embodiment of which is illustrated in FIG. 4j, through the cable 404a and the connector 404b to the board 300. In the embodiment where the connector 404b is coupled to the trace layer coupling 312, illustrated in FIGS. 4c and 4d, the signal provided by the signal generator 206 will travel through the traces 304a, 304b, 304c and 304d and to the clocks 304e, inducing a first radiation from those components that will radiate from the board 300 and into the chassis housing 204. In an embodiment, the mode stirrers 210 and 212 may be used (e.g., by rotating the rotating members 210a or 212a) to reflect radiation in the chassis housing 204. Using the mode stirrers 210 and 212 to reflect the radiation in the chassis housing 204 operates to achieve uniformity in the radiation field at any given point in the chassis housing 204, as it ensures that the radiation field has the same time-average over one rotation of the rotating members 210a or 212a at any point in the chassis housing 204. This prevents the radiation field from varying point-wise in the chassis housing 204 and achieves a homogeneous, isotropic radiation field strength. In the embodiment where the connector 404b is coupled to the power layer couplings 314a, 314b, 314c, 314d, 314e and 314f, illustrated in FIGS. 4e, 4f and 4g, the signal provided by the signal generator 206 will travel through the power plane 306a, 306b, 306c, 306d, 306e, or 306f to which that power layer coupling is coupled to, inducing a first radiation from that power plane that will radiate from the board 300 and into the chassis housing 204. In an embodiment, the mode stirrers 210 and 212 may be used (e.g., by rotating the rotating members 210a or 212a) to reflect radiation in the chassis housing 204. In experimental embodiments, it has been found that the dimensions of a power plane will effect the frequency of the first radiation from that power plane that is induced by the signal. For example, the power plane 306c would provide a first radiation that is higher in frequency than the first radiation that the power plane 306a would provide. In the embodiment where the connector 404b is coupled to the ground layer coupling 328, illustrated in FIGS. 4h and 4i, the signal provided by the signal generator 206 will travel into the board ground layer 308, inducing a radiation from the seams, apertures, and/or other discontinuities in the chassis 202 that will radiate out from the chassis 202. In an embodiment, the mode stirrers 210 and 212 may be used (e.g., by rotating the rotating members 210a or 212a) to reflect radiation in the chassis housing 204. In an embodiment, the power of the signal from the signal generator 206 is increased when the signal is provided to the board ground layer 308 relative to the power of the signal that is provided to the trace layer 304 or the power layer 306.

The method 400 then proceeds to block 408 where the radiation outside the chassis is measured. The sensor 402c, described above with reference to FIG. 4b, is operable to detect radiation that is induced by providing a signal to one of the layers on the board 300. In the embodiment where the signal is provided to the trace layer 304, the sensor 402c will measure a second radiation that results from the chassis 202 shielding at least some of the first radiation induced by providing the signal to the trace layer 304. In the embodiment where the signal is provided to the power layer 306, the sensor 402c will measure a second radiation that results from the chassis 202 shielding at least some of the first radiation induced by providing the signal to the power layer 306. In the embodiment where the signal is provided to the board ground layer 308, the sensor 402c will measure the radiation that radiates from the seams, apertures, and/or other discontinuities in the chassis 202 and is induced by providing the signal to the board ground layer 308.

Figure 4K:
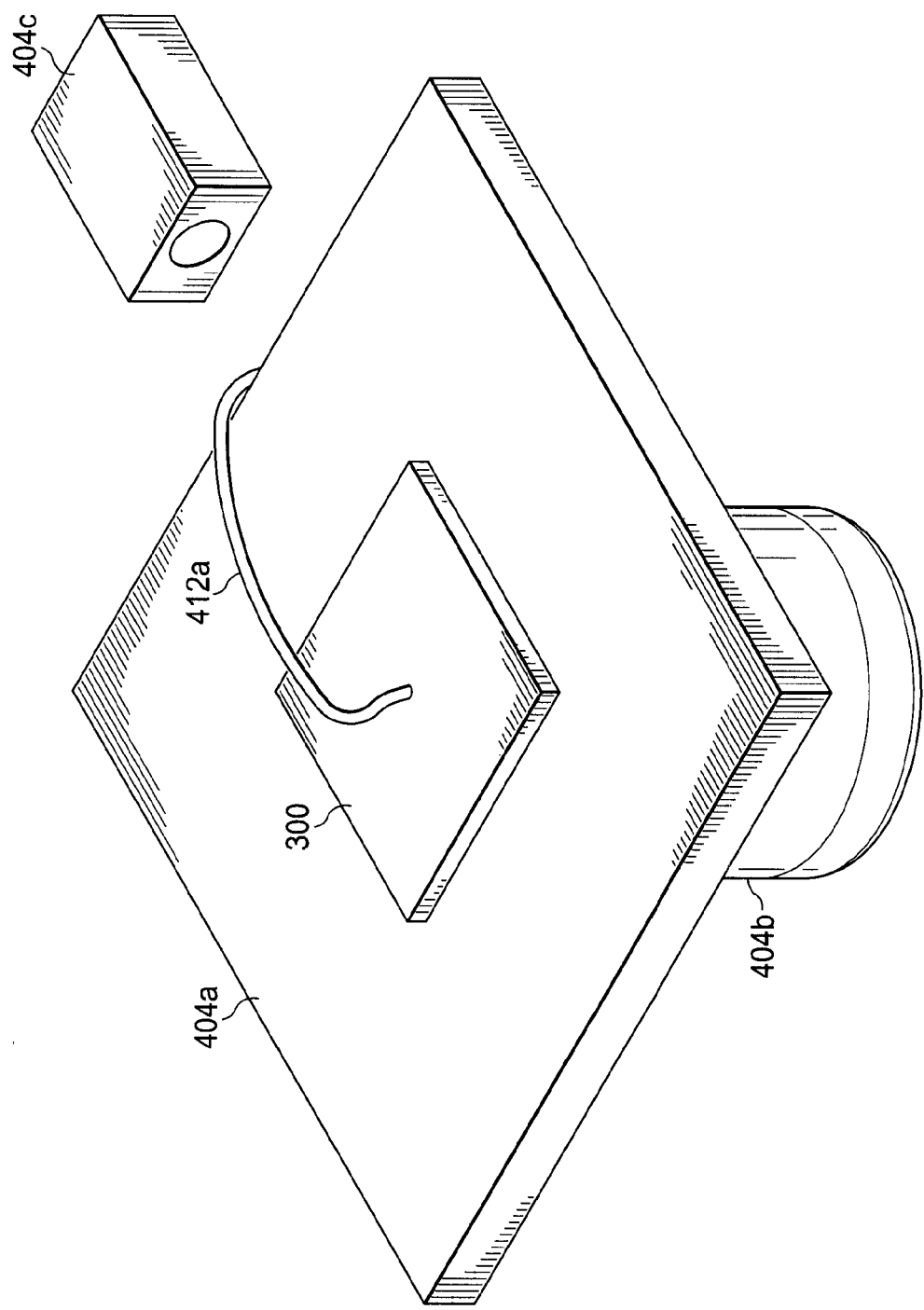

Referring now to FIGS. 4a and 4k, the method 400 then proceeds to blocks 410, 412 and 414, where the board is removed from the chassis, a signal is provided to a layer on the board, and the radiation from the board is measured. The board 300 may be removed from the chassis 202, coupled to a signal generator (not illustrated) with a cable 412a, and positioned on the support 404a, as illustrated in FIG. 4k. The cable 412a may include a connector similar to the connector 404b, described above, and may be used to couple the signal generator to the trace layer 304 or the power layer 206 in substantially the same manner as described above with reference to FIGS. 4c, 4d, 4e, 4f and 4g. A signal, which may be the same signal that was provided in block 406 of the method 400, may then be provided to the layer on the board 300 to which the signal generator is coupled, which will induce a third radiation in either the trace layer 304 or the power layer 306 that will radiate from the board 300. The sensor 404c may then measure the third radiation.

The method 400 then proceeds to block 416 where the radiation measured from the board is compared to the radiation measured outside the chassis. In a first embodiment, the chassis shielding effectiveness may be evaluated by comparing the third radiation induced in the trace layer 304 and measured in block 414 of the method 400 to the second radiation, measured in block 408 of the method 400, that results from the chassis 202 shielding at least some of the first radiation induced by providing the signal to the trace layer 304 in block 406 of the method 400. Evaluating the chassis shielding effectiveness in such a manner is more accurate than conventional techniques that provide a radiating antenna in the chassis housing, as it provides a more accurate radiation situation in the chassis 202 with the radiation emanating from the plurality of board traces 304a, 304b, 304c and 304d that are located along the board 300, rather than the radiation being provided from a signal source. In a second embodiment, the chassis shielding effectiveness may be evaluated by comparing the third radiation induced in the power layer 306 and measured in block 414 of the method 400 to the second radiation, measured in block 408 of the method 400, that results from the chassis 202 shielding at least some of the first radiation induced by providing the signal to the power layer 306 in block 406 of the method 400. Evaluating the chassis shielding effectiveness in such a manner is more accurate than conventional techniques that provide a radiating antenna in the chassis housing, as it provides a more accurate radiation situation in the chassis 202 with the radiation emanating from the power planes 306a, 306b, 306c, 306d, 306e, or 306f that may radiate at different frequencies from each other and that are positioned at different locations on the board 300, rather than the radiation being provided from a signal source. Furthermore, a new chassis shielding effectiveness evaluation method has been described that provides a signal to the board ground layer 308 that causes the chassis 202 itself to radiate. Such a method allows a plurality of chassis to be evaluated, for example, by comparing the radiation that occurs from each chassis when the signal is provided to the board ground layer and selecting the chassis that provides the lowest amount of radiation.

Thus, a system and method have been described that provide techniques for evaluating a chassis shielding effectiveness that are more accurate than conventional techniques and provide for measuring radiation that is induced from the chassis itself.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A chassis shielding effectiveness evaluation system, comprising:
   a chassis comprising a chassis ground;
   a board located in the chassis and comprising a board ground layer; and
   a signal generator comprising at least one ground member coupled to the chassis ground and a signal member coupled to the board ground layer, wherein the signal generator is operable to send a signal through the signal member to the board ground layer.

2. The system of claim 1, further comprising:
   at least one mechanical component located in the chassis.

3. The system of claim 1, further comprising:
   at least one mode stirrer located in the chassis.

4. The system of claim 1, wherein the board comprises a first board portion and a second board portion, the first board portion comprising a chassis ground layer that is coupled to the chassis ground and the second board portion comprising the board ground layer.

5. The system of claim 4, wherein the first board portion comprises a signal member coupler that is coupled to the board ground layer, and wherein the signal member is coupled to the signal member coupler.

6. The system of claim 4, wherein the first board portion comprises at least one ground member coupler that is coupled to the chassis ground layer, and wherein the at least one ground member is coupled to the ground member coupler.

7. The system of claim 1, further comprising:
a sensor located outside the chassis and operable to measure a radiation of the chassis that results from the signal generator sending the signal through the signal member to the board ground layer.

8. The system of claim 1, wherein the signal comprises a signal that is provided over a frequency range of 30 MHz to 18 GHz.

9. A method for evaluating chassis shielding effectiveness, comprising:
providing a chassis housing a board that comprises a trace layer and a power layer, wherein the trace layer comprises a plurality of traces;
providing a first signal to one of the trace layer or the power layer to induce a first radiation; and
measuring a second radiation outside the chassis that results from the chassis shielding at least some of the first radiation.

10. The method of claim 9, further comprising:
providing a second signal to one of the trace layer or the power layer with the board removed from the chassis;
measuring a third radiation that results from the second signal being provided to one of the trace layer or the power layer; and
comparing the second radiation to the third radiation to determine a chassis shielding effectiveness.

11. The method of claim 9 further comprising:
reflecting the first radiation in the chassis using at least one mode stirrer.

12. The method of claim 9, wherein the power layer comprises a plurality of power planes, and wherein at least one of the power planes is operable to radiate at a different frequency than another of the power planes when provided the first signal.

13. The method of claim 9, further comprising:
coupling a signal generator to the board such that a signal member on the signal generator is coupled to one of the trade layer or the power layer.

14. The method of claim 13, wherein the board comprises a ground layer, and the coupling the signal generator to the board comprises coupling a ground member on the signal generator to the ground layer.

15. The method of claim 9, wherein each of the plurality of traces is coupled to a clock, and wherein, in response to the first signal being provided to the trace layer, the plurality of traces and each of the clocks provide the first radiation.

16. The method of claim 9, wherein the first signal is provided over a frequency range of 30 MHz to 18 GHz.

17. A method for evaluating chassis shielding effectiveness, comprising: providing a chassis housing a board that comprises a board ground layer;
providing a signal to the board ground layer to induce a radiation from the chassis; and
measuring the radiation; wherein the board comprises a first board portion and a second board portion, the first board portion comprising a chassis ground layer that is coupled to a chassis ground on the chassis and the second board portion comprising the board ground layer, and wherein the method further comprises:
coupling a signal generator to the board, wherein the signal generator comprises a signal member that is coupled to the board ground layer and a ground member that is coupled to the chassis ground layer.

18. The method of claim 17 further comprising:
reflecting the radiation in the chassis using at least one mode stirrer.

19. The method of claim 17, wherein the signal is provided over a frequency range of 30 MHz to 18 GHz.

\* \* \* \* \*